(12) United States Patent
Minor et al.

(10) Patent No.: US 8,354,176 B2
(45) Date of Patent: Jan. 15, 2013

(54) OXIDATION-CORROSION RESISTANT COATING

(75) Inventors: Michael Minor, Arlington, TX (US);
Paul M. Pellet, Arlington, TX (US);
Michael L. Miller, Euless, TX (US);
Brian S. Tryon, Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 568 days.

(21) Appl. No.: 12/470,993

(22) Filed: May 22, 2009

(65) Prior Publication Data

US 2010/0297472 A1    Nov. 25, 2010

(51) Int. Cl.
*B32B 15/00* (2006.01)
*C22C 19/05* (2006.01)

(52) U.S. Cl. .................. 428/680; 420/445; 420/450

(58) Field of Classification Search .................. None
See application file for complete search history.

(56) References Cited

U.S. PATENT DOCUMENTS

| | | | |
|---|---|---|---|
| 4,346,137 A | 8/1982 | Hecht | |
| 4,419,416 A | 12/1983 | Gupta et al. | |
| 4,585,481 A | 4/1986 | Gupta et al. | |
| 4,909,984 A | 3/1990 | Singheiser | |
| 5,628,814 A | 5/1997 | Reeves et al. | |
| 6,919,042 B2 | 7/2005 | Beers et al. | |
| 8,075,662 B2 * | 12/2011 | Minor et al. | ..... 75/255 |
| 2003/0211356 A1 * | 11/2003 | Beers et al. | ..... 428/680 |
| 2004/0109786 A1 * | 6/2004 | O'Hara et al. | ..... 420/444 |
| 2006/0199032 A1 * | 9/2006 | Nagaraj et al. | ..... 428/632 |
| 2009/0035601 A1 | 2/2009 | Litton et al. | |
| 2010/0009092 A1 * | 1/2010 | Tryon et al. | ..... 427/456 |
| 2012/0076662 A1 * | 3/2012 | Tryon et al. | ..... 416/241 R |

FOREIGN PATENT DOCUMENTS

| | | |
|---|---|---|
| DE | 3842301 A1 | 6/1990 |
| EP | 0194391 A1 | 9/1986 |
| EP | 0532150 A1 | 3/1993 |
| EP | 1319730 A1 | 6/2003 |
| GB | 2058835 A | 4/1981 |
| GB | 2095700 A | 10/1982 |

OTHER PUBLICATIONS

European Search Report, mailed Jun. 8, 2010.

* cited by examiner

*Primary Examiner* — John J Zimmerman
(74) *Attorney, Agent, or Firm* — Kinney & Lange, P.A.

(57) ABSTRACT

A metallic coating for protecting a substrate from high temperature oxidation and hot corrosion environments comprising about 2.5 to about 13.5 wt. % cobalt, about 12 to about 27 wt. % chromium, about 5 to about 7 wt. % aluminum, about 0.0 to about 1.0 wt. % yttrium, about 0.0 to about 1.0 wt. % hafnium, about 1.0 to about 3.0 wt. % silicon, about 0.0 to about 4.5 wt. % tantalum, about 0.0 to about 6.5 wt. % tungsten, about 0.0 to about 2.0 wt. % rhenium, about 0.0 to about 1.0 wt. % molybdenum and the balance nickel.

4 Claims, No Drawings

OXIDATION-CORROSION RESISTANT COATING

BACKGROUND

Metallic coating systems are used in many situations where a metal substrate is subjected to extreme conditions such as high temperature, oxidation and corrosion producing atmospheres and the like. Metallic coating systems are particularly used in high pressure turbine applications to protect the airfoils from the aggressive combustion environment. These coatings are used to shelter components from hot corrosion and/or oxidation attack experienced by the components in these severe conditions.

Physical vapor deposition applications of metallic bond coatings permit deposition of specific chemistries in localized areas to provide the necessary environmental protection. These coatings are used as a stand-alone coating or as a bond coat for a thermal barrier ceramic topcoat.

Two major classes of metallic coatings conventionally used as protective systems against hot corrosion or oxidation of Ni-base superalloys are diffusion aluminides and overlay coatings. One family of overlay metallic coatings is described in commonly owned U.S. Pat. No. 6,919,042. These coatings include various elements added to nickel and have been found to be useful in some applications. As combustion engine technology development continues, the components are subjected to ever more corrosive and/or oxidizing attack, thus, design and implementation of coating systems with enhanced application specific capabilities (e.g., protecting against high temperature oxidation or hot corrosion) are required.

SUMMARY

The present invention provides an oxidation resistant coating that also offers hot corrosion resistance. The coating is applied as a protective overlay coating for turbine airfoil applications as well as for other components subjected to extreme conditions. The compositions of this invention may also be deposited as thin coatings that function as a brazing compound to join components. This application by utilizes the physical vapor deposit nano/micro-grain coatings in a manner similar to very precise application of a braze alloy where coated pieces are placed in intimate contact and joined by a diffusion heat treatment process.

Specifically, the compositions of this invention contain (in weight percent) cobalt (2.5-13.5), chromium (12-27), aluminum (5-7), yttrium (0.0-1.0), hafnium (0.0-1.0), silicon (1.0-3.0), tantalum (0.0-4.5), tungsten (0.0-6.5), rhenium (0.0-2.0), molybdenum (0.1-1.0) and the balance nickel.

DETAILED DESCRIPTION

The chemistry of the coatings of this invention are both oxidation resistant and hot corrosion resistant. The coatings are applied by physical vapor deposition to a substrate to be protected. Among the methods of physical vapor deposition used are sputtering, cathodic arc deposition, low pressure plasma spray, and ion beam vaporization. The coating may range in thickness from about 1.0 microns to about 100 microns, and more preferably from about 20 microns to about 80 microns. Most preferred are coatings with a thickness of from about 45 microns to about 55 microns.

The cobalt and nickel components of the coatings of this invention serve to ensure compatibility of the coatings with standard nickel superalloys that are used to fabricate many industrial products such as airfoils in turbine engines.

The group of elements comprising tantalum, molybdenum, rhenium and tungsten add considerable strength to the coatings and are necessary in some environments to make the coating function as intended.

Aluminum is used to form an environmentally resistant layer on nickel and is essential at higher temperatures. Silicon is added to the composition both to compensate for the instability of cobalt oxide at very high temperatures and to allow the use of less aluminum than may otherwise be needed.

Boron is also an important part of the coatings of this invention. Boron functions to depress the melt temperature of the coating as it is applied, and then diffuses into the substrate so that the melt temperature of the coating increases after it has been applied to a substrate.

In order to demonstrate the efficacy of these coatings, tests were conducted to determine burner rig oxidation life. In these tests, a coating was placed on a bar or coupon and mounted in a holder, in this case, a rotating spindle. The spindle rotated and was thrust into a flame for a period of time and withdrawn for a much shorter period of time, and after a number of these repetitive cycles, the oxidation was measured. The flame is a combustion product comprised of an ignited mixture of jet fuel and air. The speed of rotation of the spindle can vary from less than 400 rpm to more than 600 rpm. The samples were held in the flame for about 1 to 60 minutes, followed by removal for 1 to 5 minutes. Results were reported as a relative life, or as a ratio of life measured of the specimen over the life measured of a control. All tests were run at 2150° F. (1177° C.), although temperatures between 1800° F. (980° C.) and 2300° F. (1260° C.) can be used. The intent of this type of evaluation is to replicate the environment experienced in actual engines without having to perform the test using an actual engine.

The relative oxidation life of an uncoated substrate was determined by this test. A standard second generation Ni based superalloy uncoated substrate was used as a base line comparison and assigned a relative absolute life of 1.00.

A coating identified as Composition One had a composition of 3.0 wt. % cobalt, 24.3 wt. % chromium, 6.0 wt. % aluminum, 0.1 wt. % yttrium, 0.8 wt. % hafnium, 1.5 wt. % silicon, 3.0 wt. % tantalum, 6.0 wt. % tungsten, 0.0 wt. % rhenium, 0.0 wt. % molybdenum and the balance nickel. Substrates coated with composition One had a relative absolute oxidation life value using the same test of approximately 2.2. In other words composition One has a functioning oxidation life that was more than twice as long a functioning life as the base line uncoated substrate.

A coating identified as Composition Two had a composition of 12.0 wt. % cobalt, 13.6 wt. % chromium, 6.1 wt. % aluminum, 0.0 wt. % yttrium, 0.8 wt. % hafnium, 2.7 wt. % silicon, 3.5 wt. % tantalum, 2.8 wt. % tungsten, 1.5 wt. % rhenium, 0.8 wt. % molybdenum and the balance nickel. Substrates coated with composition Two had a relative oxidation life value of approximately 1.4, or almost half again as long a functioning life compared to the base line alloy substrate against which it is compared.

Thus, these relatively inexpensive coatings have been shown to extend the life of the substrate by about 50% to over 100%.

An additional method of assessing the oxidation life of a coating system is via cyclic furnace oxidation testing. This Furnace Cycle Oxidation Weight Change Measurement test was conducted, comparing the same uncoated Ni based superalloy substrate with a substrate coated with Composition One as set forth above. In this test, specimens of each were raised and lowered into an air furnace, with the furnace maintained at the same temperature for all of the tests. No jet fuel was used. After a certain number of cycles, the specimens were removed, and weighed and the data recorded. Cycling the same specimens was resumed.

The uncoated Ni based superalloy substrate lost considerable weight after a relatively few cycles. Specifically, the uncoated superalloy substrates lost 65 mg/cm$^2$ in 100 cycles. Substrates coated with Composition One only lost 8 mg/cm$^2$ in over 360 cycles. This is a significant improvement in oxidation resistance showing that the addition of the coating increases the oxidation durability of the components, thus, allowing parts to be in service for substantially longer periods of time.

A corrosion test was conducted to further evaluate the coatings. The test comprised taking a selected number of samples, exposing them to a salt solution, placing them in the elevated temperature in a static air furnace, without jet fuel or other combustion materials, for a period of time, such as a full day. Other time periods of less than 12 hours to more than 36 hours can be used. The samples are removed, more salt solution is applied, and the samples were reinserted in the environment. At selected periods of time, one of the samples were removed from the test apparatus and the effects of corrosion were evaluated.

Substrates coated with Composition Two identified above were compared to the standard uncoated second generation Ni based superalloy. Four coupons of each were subjected to this test. One of the four coupons was removed and evaluated at each of the times shown in Table I. Samples were metallographically prepared, and the depth of attack through the coating was measured.

Presented below in Table I are the results of this test which was run at 1650° F. (899° C.).

TABLE I

| | Hot Corrosion Test Depth of attack (mils) | |
|---|---|---|
| Time (hours) | Uncoated Ni based superalloy | Substrate with Composition Two Coating |
| 25 | 0.9 | 0.5 |
| 100 | 2.3 | 0.5 |
| 500 | 5.6 | 2.0 |
| 1000 | 9.8 | 2.7 |

As can be seen in Table I, the resistance of the coupons coated with Composition Two to hot corrosion was much greater, and was almost as effective at 1000 hours as the uncoated superalloy at 100 hours.

The coatings of this invention may be used as stand-alone coatings for oxidation or hot corrosion resistance or as a bond coat with the addition of a thermal barrier ceramic topcoat.

When used as physical vapor deposited nano/micro-grain coating, high pressure turbine components and other materials may be joined using these coatings in a manner similar to very precise applications of braze alloys. Tests have shown that the coatings are effective because they contain very small grains. Nano/micro-grain coatings are not melted when they are applied. Rather, the coating is applied to a surface or substrate, and heated. The heating anneals the grains at the grain boundary to form a strong bond as the small particles migrate on the surface. Two halves of a turbine fan blade have successfully been bonded using this type of nano/micro-grain joining process.

Although the present invention has been described with reference to preferred embodiments, workers skilled in the art will recognize that changes may be made in form and detail without departing from the spirit and scope of the invention.

The invention claimed is:

1. A metallic coating having a composition, consisting of 3.0 to 12.0 wt. % cobalt, 13.6 to 24.3 wt. % chromium, 6 to 6.1 wt. % aluminum, 0.0 to 0.1 wt. % yttrium, 0.8 wt. % hafnium, 1.5 to 2.7 wt. % silicon, 3.0 to 3.5 wt. % tantalum, 2.8 to 6.0 wt. % tungsten, 0.0 to 1.5 wt. % rhenium, 0.8 wt. % molybdenum and the balance nickel.

2. The coating of claim 1, consisting of 12.0 wt. % cobalt, 13.6 wt. % chromium, 6.1 wt. % aluminum, 0.0 wt. % yttrium, 0.8 wt. % hafnium, 2.7 wt. % silicon, 3.5 wt. % tantalum, 2.8 wt. % tungsten, 1.5 wt. % rhenium, 0.8 wt. % molybdenum and the balance nickel.

3. A coated article consisting of a superalloy substrate having a protective coating on at least a part of the substrate, the coating consisting of 3.0 to 12.0 wt. % cobalt, 13.6 to 24.3 wt. % chromium, 6 to 6.1 wt. % aluminum, 0.0 to 0.1 wt. % yttrium, 0.8 wt. % hafnium, 1.5 to 2.7 wt. % silicon, 3.0 to 3.5 wt. % tantalum, 2.8 to 6.0 wt. % tungsten, 0.0 to 1.5 wt. % rhenium, 0.8 wt. % molybdenum and the balance nickel.

4. The article of claim 3, wherein the coating consisting of 12.0 wt. % cobalt, 13.6 wt. % chromium, 6.1 wt. % aluminum, 0.0 wt. % yttrium, 0.8 wt. % hafnium, 2.7 wt. % silicon, 3.5 wt. % tantalum, 2.8 wt. % tungsten, 1.5 wt. % rhenium, 0.8 wt. % molybdenum and the balance nickel.

* * * * *